United States Patent [19]

Senda et al.

[11] Patent Number: 4,920,915
[45] Date of Patent: May 1, 1990

[54] WORK HOLDER FOR MASKING

[75] Inventors: Atsuo Senda; Toshi Numata; Tomoaki Ushiro; Takuji Nakagawa; Masaaki Taniguchi, all of Kyoto, Japan

[73] Assignee: Murata Manufacturing Co., Ltd., Japan

[21] Appl. No.: 361,500

[22] Filed: Jun. 5, 1989

[30] Foreign Application Priority Data

Jun. 7, 1988 [JP] Japan ................. 63-139826

[51] Int. Cl.⁵ ............................ B05C 1/02; B05C 3/09
[52] U.S. Cl. ..................................... 118/503; 432/253
[58] Field of Search ............... 432/253, 258; 118/500, 118/503, 504

[56] References Cited

U.S. PATENT DOCUMENTS

| | | | |
|---|---|---|---|
| 1,735,004 | 11/1929 | Hopkins et al. | 118/504 |
| 3,088,435 | 5/1963 | Wolff | 118/504 |
| 3,276,423 | 10/1966 | Triller | 118/504 |
| 3,897,324 | 7/1975 | Delmonte | 118/504 |
| 4,457,359 | 7/1984 | Holden | 118/503 |
| 4,678,531 | 7/1987 | Metzger et al. | 118/504 |
| 4,715,812 | 12/1987 | Matuscha | 432/258 |

FOREIGN PATENT DOCUMENTS 2164866  7/1987  Japan ................. 118/504

Primary Examiner—Willard Hoag
Attorney, Agent, or Firm—Ostrolenk, Faber, Gerb & Soffen

[57] ABSTRACT

A work holder (12) for holding a workpiece (2) while partially masking the same by use of a mask (18). The workpiece and the mask are elastically pressed against each other by an aggregate (15) of heat-resistant fiber such as metal fiber or ceramic fiber, so that the workpiece and the mask are brought into close contact with each other. This work holder is adapted to form a resistor film (9) on a part of the surface of a chip (2) to form a chip-type resistor (1), for example, by a thin film forming method such as sputtering.

15 Claims, 3 Drawing Sheets

WORK HOLDER FOR MASKING

BACKGROUND OF THE INVENTION

1. Field of the Invention

The present invention relates to a work holder for holding a workpiece, to which a thin film forming method such as sputtering, ion plating or vacuum evaporation is applied, while partially masking the same. More particularly, it relates to a workpiece holder for masking, which is employed for forming a conductor film or a resistor film on a specific part of the surface of a miniature chip-type electronic component such as a chip-type resistor or a chip-type capacitor by a thin film forming technique.

2. Description of the Background Art

In order to obtain a chip-type electronic component such as a chip-type resistor or a chip-type capacitor, for example, a conductor film or a resistor film is formed on a specific part of the surface of a workpiece such as a substrate or a component body. When such a conductor film or resistor film is formed through a thin film forming technique such as sputtering, ion plating or vacuum evaporation, it is necessary to mask a part, which must not be covered with the film, of the workpiece surface. Usually, a single mask is applied to an array comprising a large number of workpieces, and such a mask is usually fixed to a work holder only at its peripheral portion. Hence, an undesirable clearance is inevitably defined between the central portion of the mask and the surface of each workpiece. When such a clearance is undesirably defined between the workpiece surface and the mask, therefore, evaporation particles may enter the clearance, and may spread the film to a region of the workpiece which must not be covered with the film. Therefore, to avoid this problem, it is necessary to bring the mask into close contact with the part of the workpiece surface that is to be masked.

Prior structures for pressing a workpiece against a mask have employed a spring on the work holder, in order to give intimate contact between the workpiece and the mask. However, a work holder for simultaneously holding a large number of miniature workpieces requires such a spring for every workpiece, and hence its structure is complicated. Further, it is not easy to charge (load) the workpieces into such a work holder since the springs must be compressed to define spaces for receiving the workpieces. In addition, the springs are annealed by the heat which is applied in connection with the film forming step and hence their elasticity deteriorates.

On the other hand, an attempt has been made to replace the aforementioned spring by a rubber member, in order to apply a force by the member's elasticity. In general, however, rubber cannot resist a heating temperature of 200° C. in a vacuum state. Hence, such a rubber member cannot resist the environmental temperature of sputtering, for example. Further, rubber evolves gas under a high temperature. Such gas contaminates the film or reduces adhesion between the film and the workpiece.

SUMMARY OF THE INVENTION

Accordingly, an object of the present invention is to provide a work holder which can improve the adhesion between a work (workpiece) and a mask.

Another object of the present invention is to provide a work holder having simple structure, which can be easily charged (loaded) with a work.

Still another object of the present invention is to provide a preferable heat-resistant material which is employed as an elastic force applying means, for bringing a work into close contact with a mask.

The present invention provides a work holder for holding a work while partially masking the same. The work holder comprises mask means having a surface which is brought into contact with a part of the work surface to be masked. The mask means and the work are elastically pressed against each other by elastic force applying means. The elastic force applying means includes an aggregate of heat-resistant fiber.

The heat-resistant fiber is prepared from metal fiber or ceramic fiber, for example.

According to the present invention, the mask means and the work are brought into close contact with each other by the force due to the elasticity of the aggregate of the heat-resistant fiber. Therefore, evaporation particles are prevented from reaching the part of the of the work where they are not desired, whereby the configuration and dimensional accuracy of a film formed on the work surface can be improved.

Further, the heat-resistant metal or ceramic fiber is completely protected from being damaged by a thin film forming step, such as a sputtering step, which is carried out in a high-temperature environment. Thus, the heat-resistant fiber has excellent durability and does not interfere with film formation. Further, the aggregate of such heat-resistant fiber can be freely shaped, so that it can be easily incorporated into the work holder, thereby simplifying the structure of the work holder.

These and other objects, features, aspects and advantages of the present invention will become more apparent from the following detailed description of embodiments of the present invention when taken in conjunction with the accompanying drawings.

DESCRIPTION OF THE PREFERRED EMBODIMENTS

Figure 1:
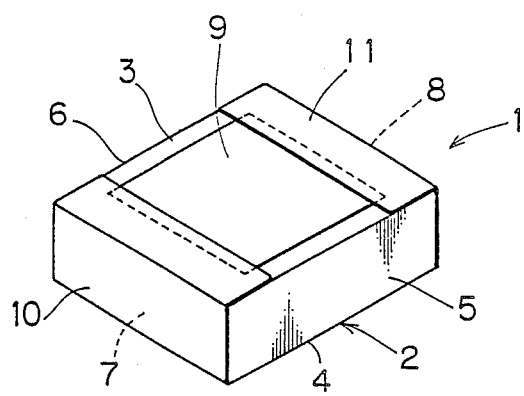
FIG. 1 is a perspective view showing a chip-type resistor obtained by using a work holder according to the present invention.

As shown in FIG. 1, a chip-type resistor 1 comprises a chip 2 of an insulating material such as alumina. The chip 2 is in the form of a rectangular parallelepiped, and comprises an upper surface 3, a lower surface 4, two side surfaces 5 and 6 and two end surfaces 7 and 8. A resistor film 9 of NiCr, for example, is formed on a specific region of the upper surface 3. A conductor film 10 is formed on the end surface 7 and a part of the upper surface 3 to cover an end portion of the resistor film 9. Another conductor film 11 is formed on the end surface 8 and a part of the upper surface 3 to cover another end portion of the resistor film 9.

Figure 2:
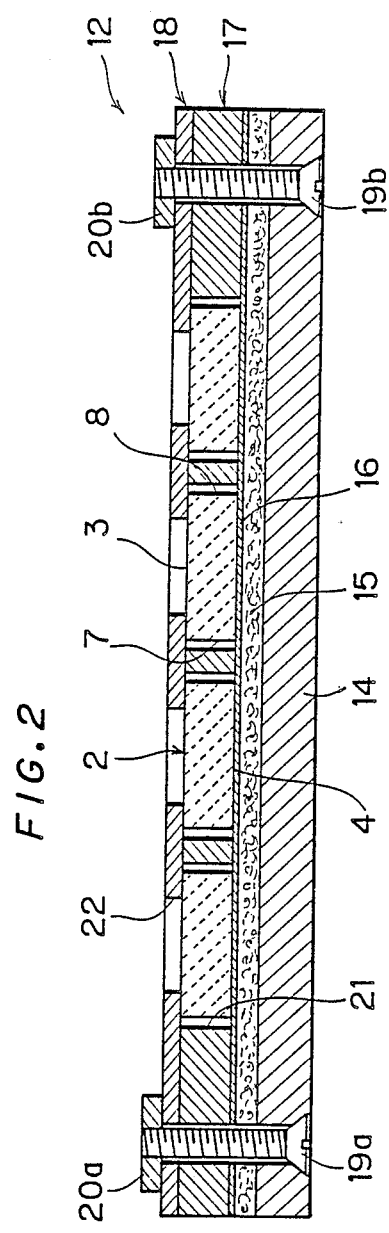
FIG. 2 is a sectional view showing an embodiment of the present invention.
Figure 3:
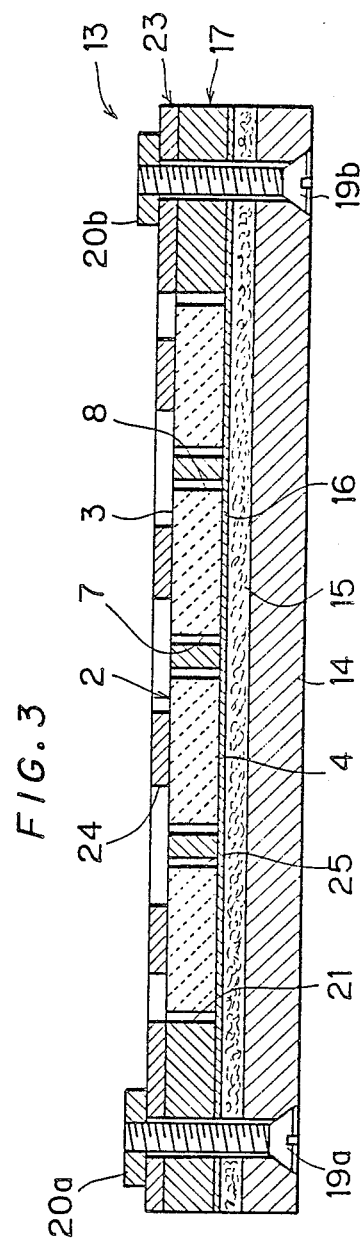
FIG. 3 is a sectional view showing a modification in which a mask provided in the work holder shown in FIG. 2 is replaced by another mask.

In such a chip-type resistor 1, the resistor film 9 is formed by using a work holder 12 shown in FIG. 2, and the conductor films 10 and 11 are formed by using a work holder 13 shown in FIG. 3.

As shown in FIG. 2, the work holder 12 comprises a back plate 14 of stainless steel. An aggregate 15 of stainless steel fiber is placed on the back plate 14. A first mask 16 of a flexible sheet material such as aluminum foil, for example, is placed on the fiber aggregate 15. A spacer 17 of stainless steel, for example, is placed on the first mask 16. A second mask 18 formed from a stainless steel plate, for example, is placed on the spacer 17. In order to regulate the space between the back plate 14 and the second mask 18, bolts 19a and 19b are inserted to pass through the back plate 14 and the second mask 18. These bolts 19a and 19b are engaged with nuts 20a and 20b respectively.

The fiber aggregate 15, which is formed by compressing intertwined fine wires of stainless steel into the form of a sheet, is properly elastically deformable against compression as a whole.

The spacer 17 is provided with a plurality of cavities 21, each of which receives a work, namely the chip 2 shown in FIG. 1.

The second mask 18 is provided with a plurality of openings 22, each of which has a configuration correlative with the resistor film 9 shown in FIG. 1.

As shown in FIG. 2, the fiber aggregate 15 is compressed when the holder 12 is charged with the chips 2. Therefore, the chips 2 are upwardly pressed, via the first mask 16, by the elastic force exerted by the fiber aggregate 15. Hence, the upper surfaces 3 of the chips 2 are brought into close contact with the second mask 18.

When the chips 2 are introduced into a sputtering apparatus, for example, in the state shown in FIG. 2, films such as the resistor film 9 (FIG. 1), for example, are formed on the upper surfaces 3 of the chips 2 in regions corresponding to the openings 22 of the second mask 18.

An experiment was made to confirm the effect of the fiber aggregate 15 using the work holder 12 shown in FIG. 2. The work holder 12 was charged with alumina chips 2 that were 3 mm×2.5 mm×1 mm in size, and set in a sputtering apparatus. This sputtering apparatus was set in an argon atmosphere of $2 \times 10^{-3}$ Torr. and evaporation particles emitted from a target of Ni 50%-Cr 50% were adhered to prescribed regions of the upper surfaces 3 of the chips 2, thereby to form resistor films of NiCr of 800 Å in thickness. The openings 22 of the second mask 18 were 2.00 mm×2.00 mm in size. The average size of the resistor films thus obtained was 2.018 mm×2.018 mm with small dispersion of 9 μm. Thus, the resistor films were formed with high accuracy. On the other hand, a reference test was made in which sputtering was performed with no fiber aggregate. The average size of the resistor films thus obtained was 2.248 mm×2.248 mm, with significant dispersion of 133 μm.

In the work holder 13 shown in FIG. 3, the second mask 18 of the work holder 12 shown in FIG. 2 is replaced by a third mask 23. The third mask 23 has openings 24 for enabling formation of the conductor films 10 and 11 shown in FIG. 1. Clearances 25 are defined between both end surfaces 7 and 8 of the chips 2 received in the cavities 21 and the opposing wall surfaces defining the cavities 21, so that the aforementioned openings 24 communicate with the clearances 25. With to the work holder 13 shown in FIG. 3, therefore, the chips 2 are exposed at their portions that are intended to be provided with the conductor films 10 and 11 shown in FIG. 1. The cavities 21 are also define by wall surface (not shown) of the spacer 17 and facing the side surfaces 5 and 6 of the chips 2, which are selected in configurations to be closely in contact with the side surfaces 5 and 6. Yet, small clearances may inadvertently be undesirably defined between the side surfaces 5 and 6 of the chips 2 and the cavities 21 due to a problem in dimensional accuracy. However, even if evaporation particles enter such clearances, the amount thereof is rather small and the particles do not cause serious problems as compared with those adhered to undesired regions of the upper surfaces 3 and the lower surfaces 4 of the chips 2.

Figure 4:
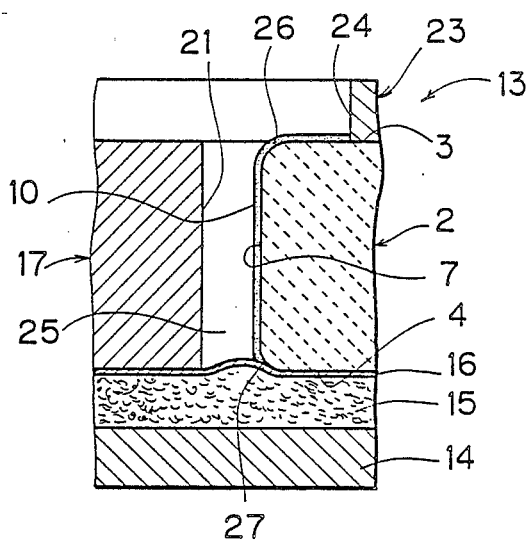
FIG. 4 is an enlarged view showing a part of the work holder shown in FIG. 3.

The conductor films 10 and 11 shown in FIG. 1 are formed by use of the work holder 13 shown in FIG. 3. As shown in FIG. 4, evaporation particles supplied through the opening 24 of the third mask 23 and the clearance 25 are adhered to the exposed surface of the chip 2, thereby to form the conductor film 10 over the end surface 7 of the chip 2 and the conductor film 11 over the end surface 8. At this time, the first mask 16 is in close contact with the lower surface 4 of the chip 2 and the third mask 23 is in close contact with a part of the upper surface 3 of the chip 2, so that no conductor film 10 or 11 is formed on the regions which are in contact with the first and third masks.

As shown in FIG. 4, ridge portions 26 and 27 of the chip 2 may be rounded particularly in a chip-type monolithic capacitor. In this case, the flexible first mask 16 is deflected along the rounded ridge portion 27, for example, thereby to strictly prevent evaporation particles from entering the lower surface 4 of the chip 2.

In general, in making a chip-type monolithic capacitor, the chip 2 has been turned over after the conductor film 10 is formed on the end surface 7 and on a part of the upper surface 3 as shown in FIG. 4, which shows the formation of the conductor film 10, and is again held in the work holder 13 as shown in FIG. 3. Thin film formation is again performed with the chip 2 in this position, thereby to spread the conductor films 10 and 11 over respective end portions of the lower surface 4 of the chip 2.

Strictly speaking, the first mask 16, which is shown in FIGS. 2 and 3 as being included in the work holder 12 or 13, is required only for the thin film forming operation using the work holder 13 as shown in FIG. 3. However, the first mask 16 is also included in the work holder 12 shown in FIG. 2 so that the manufacturing process may be readily advanced from the step shown in FIG. 2 to that shown in FIG. 3 by simply replacing the second mask 18 with the third mask 23.

The material for the first mask 16 is not restricted to being aluminum foil but may also be prepared from another metal foil or a film of fluororesin having high heat resistance such as polytetrafluoroethylene (PTFE). The first mask 16 is preferably formed of a chemically stable material so that evaporation particles adhered thereto can be chemically removed to enable repeated use of the first mask 16.

Figure 5:
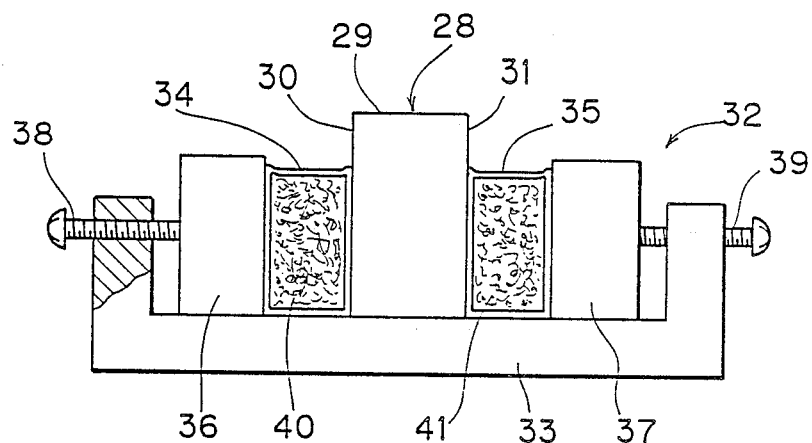
FIG. 5 is a front elevational view showing another embodiment of the present invention.

FIG. 5 shows a work holder 32 for forming a film over an upper surface 29 and respective upper portions of side surfaces 30 and 31 of a work 28. The work holder 32 comprises a U-shaped holder body 33, which is adapted to receive the work 28 in its central portion and is provided with masks 34 and 35 and keeper plates 36 and 37 on both sides thereof. Positions of the keeper plates 36 and 37 with respect to the holder body 33 can be changed by bolts 38 and 39 which are engaged with the holder body 33.

The masks 34 and 35 are prepared from a flexible sheet material such as aluminum foil in the form of cylinders or bags, and filled with aggregates 40 and 41 of stainless steel fiber, for example.

Figure 6:
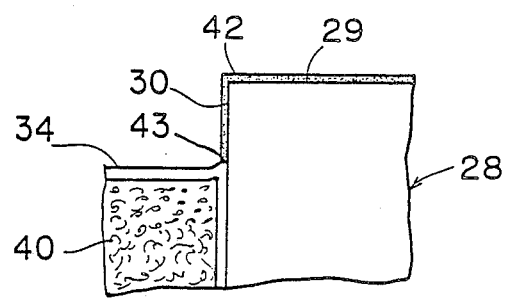
FIG. 6 is an enlarged view showing a part of the work holder shown in FIG. 5.

The masks 34 and 35 are arranged on both sides of the work 28 and held by the keeper plates 36 and 37. They are brought into close contact with prescribed regions of the side surfaces 30 and 31 of the work 28 by force exerted by the fiber aggregates 40 and 41. At this time, the masks 34 and 35 are deformed as shown in an enlarged view in FIG. 6, to attain close contact conditions over their entire respective regions which are in contact with the work 28. When a film 42 is shaped as shown in FIG. 6, therefore, an edge 43 of the film 42 provides a clear configuration.

The material for the masks 34 and 35 employed in this embodiment is not restricted to being aluminum foil but may be prepared from another flexible sheet material having heat resistance.

Further, the heat-resistant fiber material for the fiber aggregate 15, 40 or 41 is not restricted to being the aforementioned stainless steel fiber, but may be prepared from another metal fiber or ceramic fiber.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A work holder for holding a workpiece while partially masking the same, said work holder comprising:
   mask means having a masking surface to be brought into contact with a part of a surface of said workpiece to be masked; and
   elastic force applying means for elastically pressing said mask means and said workpiece against each other,
   said elastic force applying means including an aggregate of heat-resistant fiber.

2. A work holder in accordance with claim 1, wherein said heat-resistant fiber includes ceramic fiber.

3. A work holder in accordance with claim 1, wherein said heat-resistant fiber includes metal fiber.

4. A work holder in accordance with claim 3, wherein said heat-resistant fiber includes a sheet comprising intertwined fine stainless steel wires which sheet is elastically deformable by compression.

5. A work holder in accordance with claim 1, wherein said elastic force applying means includes means for regulating the space between said mask means and said workpiece, said fiber aggregate being supported by said space regulating means for applying force in a direction for forcing said mask means and said workpiece against each other.

6. A work holder in accordance with claim 5, wherein said mask means is in the form of a rigid plate.

7. A work holder in accordance with claim 6, wherein said space regulating means comprises plate means which is opposite to said mask means on the other side of said workpiece and coupling means for maintaining a constant space between said plate means and said mask means, said fiber aggregate being positioned between said plate means and said workpiece.

8. A work holder in accordance with claim 5, wherein said mask means is formed by a flexible sheet, said fiber aggregate being positioned to be in contact with said mask means.

9. A work holder in accordance with claim 6, further comprising a flexible sheet interposed between said fiber aggregate and said workpiece and serving as a further mask for said workpiece.

10. A work holder in accordance with claim 9, wherein said flexible sheet comprises aluminum foil.

11. A work holder in accordance with claim 9, wherein said flexible sheet has embossed means projecting out of a plane defined by said flexible sheet for providing additional masking for said workpiece.

12. A work holder in accordance with claim 8, wherein said flexible sheet forms a wrapping which contains said fiber aggregate.

13. A work holder in accordance with claim 8, wherein said flexible sheet comprises a material selected from the group consisting of aluminum foil, fluororesin film, and PTFE.

14. A work holder in accordance with claim 9, wherein said flexible sheet comprises a fluororesin film.

15. A work holder in accordance with claim 14, wherein said flexible sheet comprises PTFE.

* * * * *